United States Patent
Tseng (10) Patent No.: US 6,531,781 B2
(45) Date of Patent: Mar. 11, 2003

(54) FABRICATION OF TRANSISTOR HAVING ELEVATED SOURCE-DRAIN AND METAL SILICIDE

(75) Inventor: Horng-Huei Tseng, Hsin-Chu (TW)

(73) Assignee: Vanguard International Semiconductor Corporation (TW)

( * ) Notice: Subject to any disclaimer, the term of this patent is extended or adjusted under 35 U.S.C. 154(b) by 42 days.

(21) Appl. No.: 09/734,893

(22) Filed: Dec. 13, 2000

(65) Prior Publication Data

US 2002/0072181 A1 Jun. 13, 2002

(51) Int. Cl.⁷ ............................................... H01L 23/48
(52) U.S. Cl. ..................... 257/770; 257/288; 257/774; 257/753
(58) Field of Search ................................. 257/288, 774, 257/753–757, 768–770

(56) References Cited

U.S. PATENT DOCUMENTS 6,051,473 A  *  4/2000  Ishida et al. ................ 438/300
6,090,691 A  *  7/2000  Ang et al. ................... 438/564

OTHER PUBLICATIONS

Wolf, "Silicon Processing For The VLSI Era", Lattice Press, vol. 1, p. 181.*

"MOSFET Drain Engineering Analysis for Deep–Submicrometer Dimensions: a New Structural Approach," *IEEE Transactions on Electron Devices*, vol. 39, No. 8 (Aug. 1992), p. 3.

* cited by examiner

*Primary Examiner*—Nathan J. Flynn
*Assistant Examiner*—Scott R. Wilson (57) ABSTRACT

A method of forming a transistor, the method comprises following steps: provides a substrate; covers part of the substrate by a doped amorphous silicon layer and covers part of the substrate by a first dielectric layer; forms a metal silicide layer on the doped amorphous silicon layer; removes the first dielectric layer to form a window; forms a second dielectric layer on both the metal silicide layer and the hole; and forms a conductor layer on the second dielectric layer. Significantly, during formation of the second dielectric layer, not only numerous dopants inside the doped amorphous silicon layer are driven into the substrate but also the doped amorphous silicon layer usually is re-crystallized to form an epi-like silicon layer.

21 Claims, 9 Drawing Sheets

FABRICATION OF TRANSISTOR HAVING ELEVATED SOURCE-DRAIN AND METAL SILICIDE

BACKGROUND OF THE INVENTION

1. Field of the Invention

The invention pertains to transistor, and particular to method for forming transistor that has both elevated source-drain and metal silicide.

2. Description of the Prior Art

One trend of the semiconductor industry is to make semiconductor devices as small as possible. However, process technology or methods used in forming such devices impose limitations on how small a device can be made.

Figure 1:
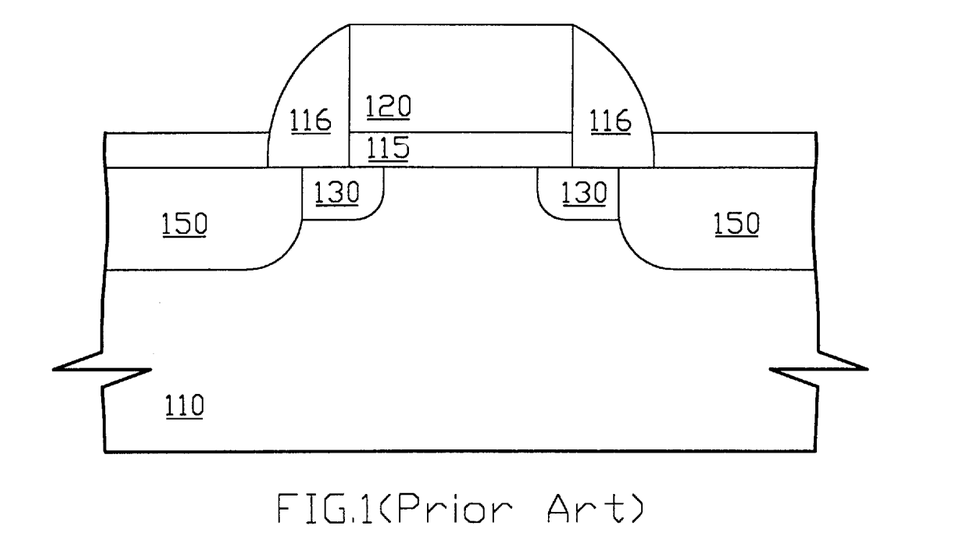
FIG. 1 is a cross-sectional view of a conventional MOSFET.

A typical semiconductor device and a primary building block in the semiconductor industry is the transistor, especially the metal oxide semiconductor field effect transistor (MOSFET). Referring to FIG. 1, a MOSFET is typically composed of gate conductor layer 120, sidewall 116 and gate dielectric layer 115 which both are formed over substrate 110, herein gate conductor layer 120 is usually composed of polysilicon and gate dielectric layer 115 is usually composed of oxide. Within substrate 110 are formed deep source-drain regions 150 (sometimes referred to as heavily doped source and drain regions) and source-drain extension regions 130 (sometimes referred to as lightly doped source-drain region). In general, doped regions are regions contain a higher concentration of P-type or N-type dopants than substrate 110. Source-drain extension regions 130 generally have a lower concentration of dopants compared to deep source-drain regions 150, although sometimes these regions can be doped at equivalent levels. Further, source-drain extension regions 130 have a thickness, which is smaller than thickness of deep source-drain regions 150. Shallow source-drain extension regions 130 are important for reducing hot carrier injection (HCI), which often occurs in scaled down (e.g. sub-micron) devices, and for maintaining other device characteristics such as threshold voltage rolloff, punchthrough, and other short channel characteristics. Thicker deep source-drain regions 150 are generally important for lowering device resistivity, for maxing device current and for forming contact.

In reducing the size of MOSFET devices, much of the focus has been on reducing the length of gate conductor 120. As the length is reduced, however, the device size must also be reduced in the vertical direction. That is to say that thickness of source-drain extension regions 130 also must be reduced. However, formation of shallow source-drain extension regions 130 requires precise control of dopant distribution on a fine scale. Unfortunately, while technology will allow other portions of MOSFET devices to be scaled smaller, e.g. gates scaled in sub-micron lengths, limitations in forming finely scaled source-drain extension regions 130 have prevented semi-conductor devices from reaching their smallest dimensions. These limitations often arise as a result of heat steps, including annealing process for repairing and achieving doped regions, but also causing diffusion of dopants.

Figure 2:
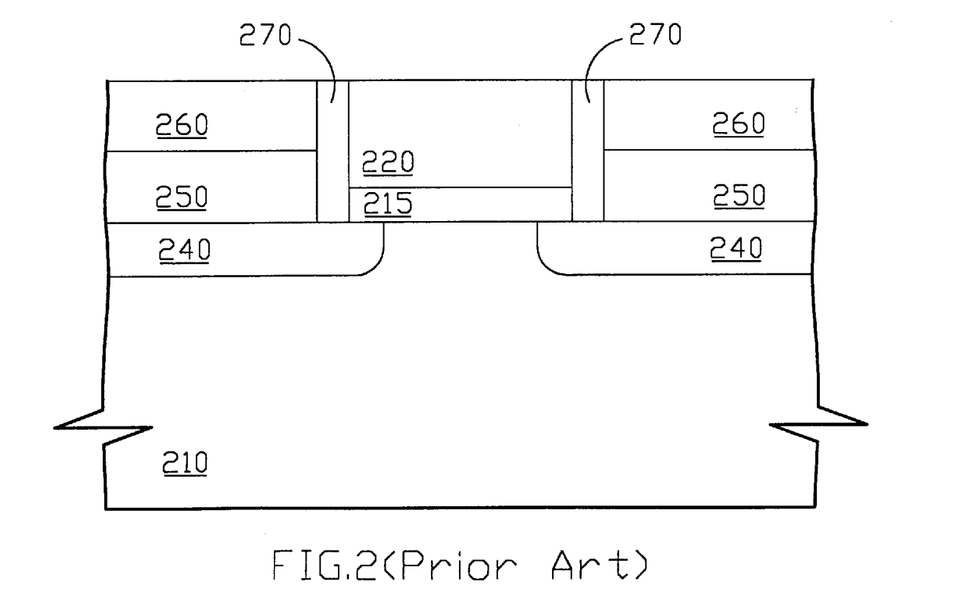
FIG. 2 is a cross-sectional view of a HCS MOSFET.

One proposed structure which allows for small device scaling while avoiding small scale source-drain extension formation problems is the elevated source-drain MOSFET, which also is called as raised source-drain MOSFET. One type of elevated source-drain MOSFET is the hot-carrier suppressed (HCS) MOSFET, a cross-section of which is shown in FIG. 2, that includes substrate 210, gate dielectric 215, gate conductor 220 and sidewall 270. Besides, HCS MOSFET also has source and drain region 240 in substrate 210.

Rather than using source-drain extension regions, the HCS MOSFET has elevated layers 250 which perform the same functions as source-drain extension regions in conventional MOSFETs but avoid the dopants diffusion problem in their formation. That is, layers 250 reduce, or suppress, hot-carrier injection. Further, in order to provide lower sheet and contact resistance, additional layers 260 are utilized. Herein, doping concentration of additional layers 260 is higher than that of elevated layers 250. Besides, because many of the functions of the deep source-drain regions of conventional MOSFETs are fulfilled by the additional layer 260, HCS MOSFET source and drain regions 240 can be remain shallow, which is desirable in forming smaller devices. More detailed information regarding the general structure and performance of HCS MOSFETs devices can be found in Shin et al., "MOSFET Drain Engineering Analysis for Deep-Submicrometer Dimensions: A New Structural Approach", IEEE Transactions on Electron Devices, Vol. 39, No. 8 (August 1992).

While elevated source-drain MOSFETs have comparable performance characteristics to those of conventional MOSFETs while at the same time permitting the formation of smaller devices when compared with conventional MOSFETs, use of elevated source-drain MOSFETs has not become widespread. The devices are difficult to manufacture for al least following reasons. First, as shown in FIG. 2, elevated layers 250 and second layers 260 must be selectively grown, which is a difficult task involving high vacuum and chemical vapor deposition processes. Such processes further requires expensive equipment, are difficult to control, critically rely on surface preparation, and are cagily ruined by a small amount of contamination.

Second, source and drain regions 240 are doped using conventional methods, e.g. ion implantation, prior to forming elevated layers 250 and second layers 260. For the same reasons that source-drain extension regions depth in a conventional MOSFET is difficult to control, so too is it difficulty to maintain shallow source and drain regions 240, which are desirable in forming small scale elevated source-drain MOSFETs. Further, the heat cycles in both elevated layers 250 and second layers 260 formation cause the dopants to diffuse.

Third, qualify of sidewall 270 of elevated source-drain MOSFETs is generally lacking. Sidewalls of sufficient uniform thickness are necessary to control capacitance between gate the raise source-drain regions (layers 250 and 260). Such sidewall 270, however, are general grown or deposited on the gate prior to forming layers 260/260, and the ability to form sidewalls of adequate uniform thickness to sufficiently control capacitance is extremely difficult (for example, shape of deposited sidewall 270 is fan-shape), particularly when subjected to the forming process of both layers 260/260.

Moreover, because that metal silicide has been widespread used to reduced the resistance between the MOSFET and conductive lines, and also because an unavoidable problem is that thermal processes of formation of metal silicide further induces diffusion of doped dopants. It is crystal-clear that outline of shallow source and drain regions 240 is broaden, which is more strong when outline of shallow source and drain regions 240 has been broaden by thermal process of formation of both sidewall and layers 250/260. Then, directly, qualify of the elevated source-drain MOSFET is further degraded by application of metal silicide.

Therefore, it is desirable to develop a process that will allow for easier manufacturabiliy of elevated source-drain MOSFETs, and thus allow for semiconductor device formation of reduced size.

SUMMARY OF THE INVENTION

Objects of the present invention at least include forming the elevated source-drain MOSFET without disadvantage of conventional fabrication of elevated source-drain MOSFET.

Objects of the present invention further comprise integrating forming processes of gate dielectric layer, elevated source-drain and metal silicide during fabrication of source-drain MOSFET.

Still an object of the invention is to present a new structure of the elevated source-drain MOSFET.

In short, one method present by the invention at least includes following basic steps: provides a substrate; covers part of the substrate by a doped amorphous silicon layer and covers part of the substrate by a first dielectric layer; forms a metal silicide layer on the doped amorphous silicon layer; removes the first dielectric layer to form a window; forms a second dielectric layer on both the metal silicide layer and the hole; and forms a conductor layer on the second dielectric layer. Significantly, during formation of the second dielectric layer, not only numerous dopants inside the doped amorphous silicon layer are driven into the substrate but also the doped amorphous silicon layer usually is re-crystallized to form an epi-like silicon layer.

Further, one structure present by this invention at least includes following elements: a U-shape dielectric layer on a substrate; a conductor layer in the hollow of the U-shape dielectric layer; a first doped region in the substrate and on one side of the U-shape dielectric layer; a second doped region in the substrate and on another side of the U-shape dielectric layer; and a polysilicon layer on both the first doped region and the second doped region. Certainly, the structure further comprises a metal silicide layer on the polysilicon layer.

BRIEF DESCRIPTION OF THE DRAWINGS

Preferred embodiments of the invention are described below with reference to the following accompanying drawings.

DESCRIPTION OF THE PREFERRED EMBODIMENT

The Applicant directly points out a key point for solving most of disadvantages of fabrication of conventional elevated source-drain MOSFET: diffusion of dopants can be reduced by decreasing both period and temperature of all processed thermal processes. Further, because that both temperature and period of each processed thermal process is limited and arbitrary decrease of temperature will induces unexpected risk, for example dielectric layer can not be properly deposited when temperature too low to let each reactant fully reacts with other reactants, a more effective way is to perform all required thermal processes at the period. Surely, while several thermal processes are performed simultaneously, both temperature and period should be adjusted to satisfy all requirements of all thermal processes.

For instance, when first thermal process with temperature T1 and period P1, second thermal process with temperature T2 and period P2 and third thermal process with temperature T3 and period P3 are performed in sequence in fabrication of a semiconductor device, the net period of thermal process that the semi-finished product will pass through is T1+T2+T3. However, while the fabricating processes is modified to let first thermal process, second thermal process and third thermal process are performed at the time, the net period of thermal process that the semi-finished product will pass through only about is the maximum of T1, T2 and T3. Significantly, the net period that the semi-finished product is treated by all thermal processes is efficiently reduced, and then effect of dopants diffusion that induced by thermal is efficiently reduced.

Figure 3:
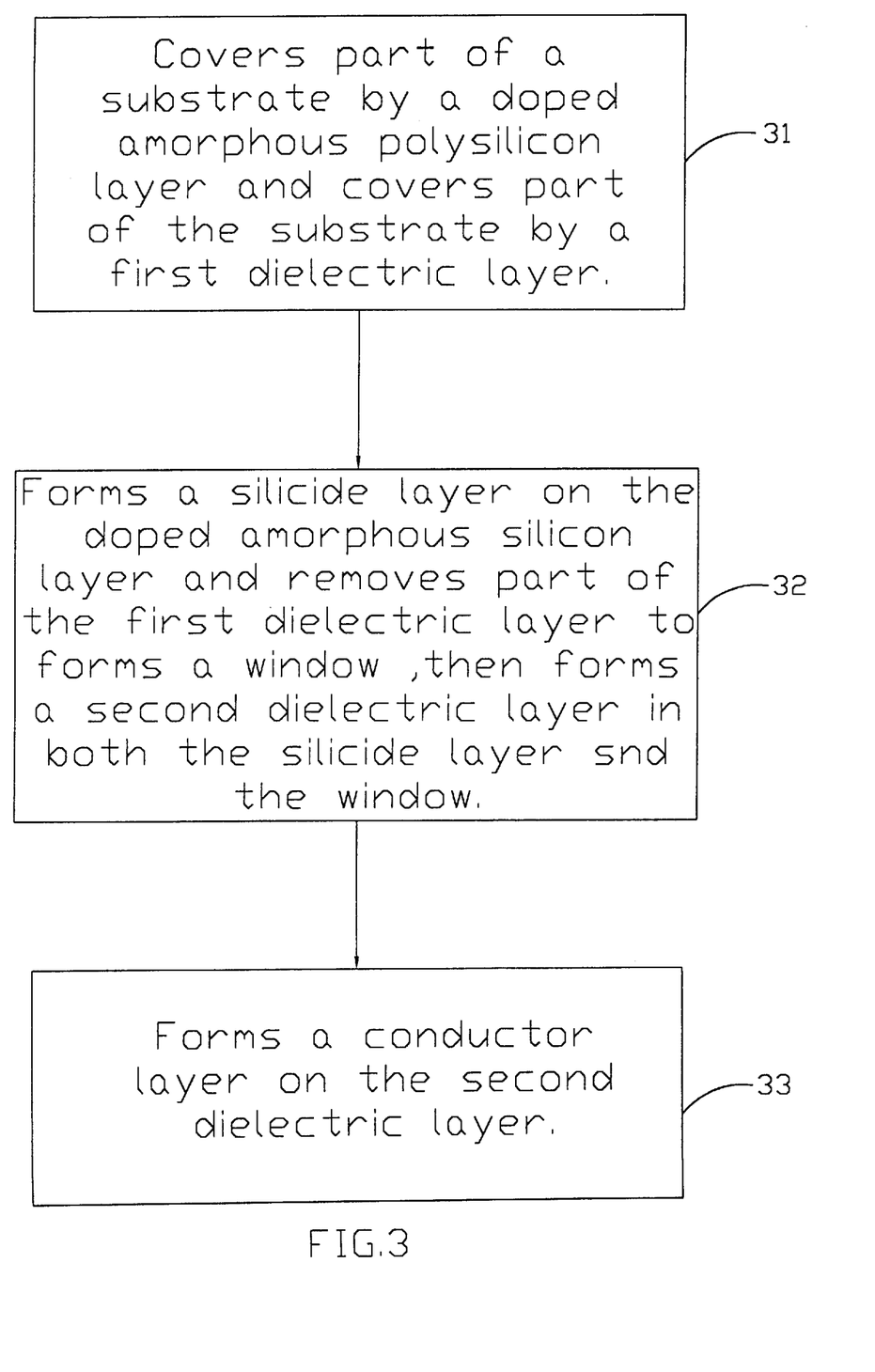
FIG. 3 is a briefly flowchart of a present method of the invention.

Therefore, in accordance with previous issue, the Applicant presents a method for forming a transistor with both elevated source-drain and metal silicide. Referring to FIG. 3, the present method at least includes following basic steps: As cover block 31 shows, covers part of a substrate by a doped amorphous silicon layer and covers part of the substrate by a first dielectric layer; as simultaneous block 32 shows, forms a metal silicide layer on the doped amorphous silicon layer and removes part of the first dielectric layer to form a window, and forms a second dielectric layer on both the metal silicide layer and the window; and as gate block 33 shows, forms a conductor layer on the second dielectric layer.

Figure 4A:
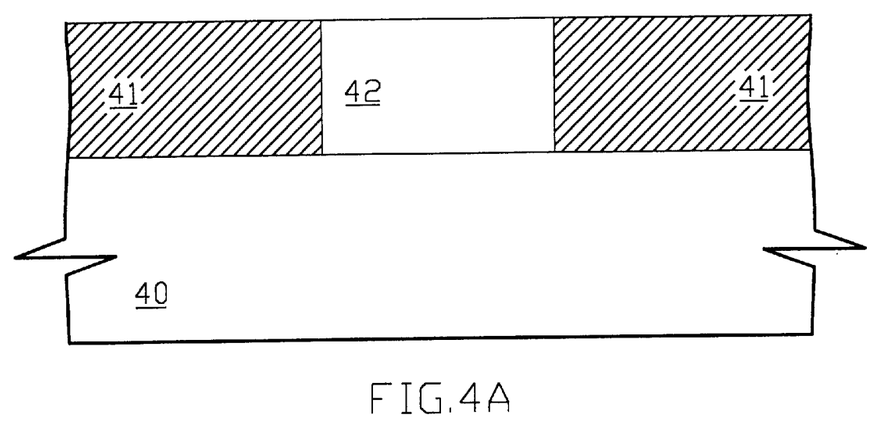
FIG. 4A through FIG. 4J are cross-sectional views of an elevated source-drain MOSFET in various stages of formation in accordance with one embodiment of the invention.

First preferred embodiment of the invention is a method of forming a transistor. In FIG. 4A, substrate 40 is provided, and part of substrate 40 is covered by doped amorphous silicon layer 41 and part of substrate 40 by first dielectric layer 42. Herein, as usual, any part of doped amorphous silicon layer 41 is not covered by first dielectric layer 42 and any part of first dielectric layer 42 is not covered by doped amorphous silicon layer 41. Besides, an optional step is to planarizate, a typical method is chemical mechanical polishing method (CMP method), surface of both doped amorphous silicon layer 41 and first dielectric layer 42. Moreover, main function of first dielectric layer 42 is to define location of gate of transistor. Further, first dielectric layer 42 usually is a silicon dioxide layer and a typical thickness is about form 1000 angstroms to 4000 angstroms, and thickness of doped amorphous silicon layer 41 is about from 1000 angstroms to 4000 angstroms.

Herein, FIG. 4A could be formed by following steps: form first dielectric layer 42 on substrate 40; patterns first dielectric layer 42; and forms doped amorphous silicon layer 41 on exposed part of substrate 40, wherein an optional step is planarizating doped amorphous silicon layer 41 until the height of doped amorphous silicon layer 41 is briefly equivalent to the height of first dielectric layer 42. Of course, FIG. 4A also could be formed by following steps: forms doped amorphous silicon layer 41 on substrate 40; patterns doped amorphous silicon layer 41; and forms first dielectric layer 42 on the exposed part of substrate 40, it also includes an optional step that planarizates first dielectric layer 42 until the height of first dielectric layer 42 is briefly equivalent to the height of doped amorphous silicon layer 41.

Figure 4B:
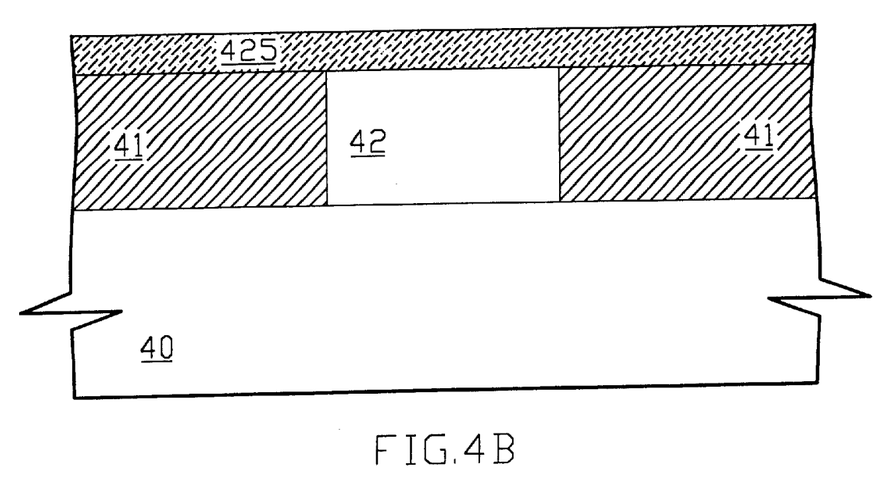
Figure 4C:
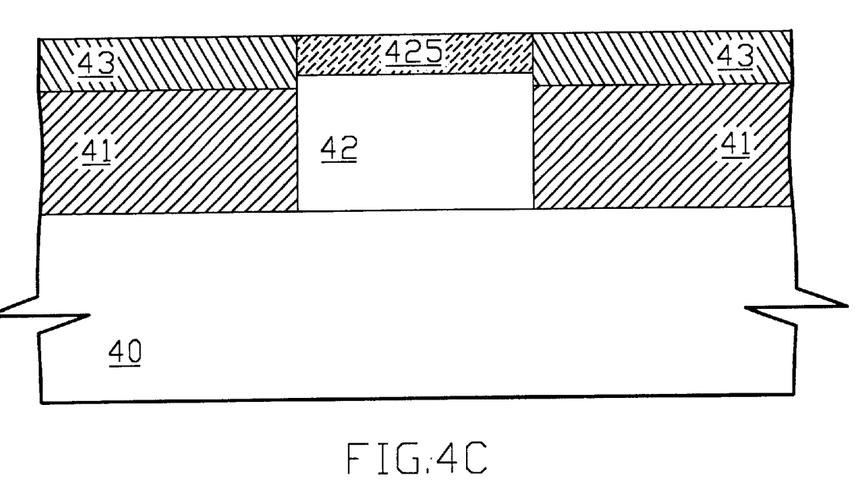
Figure 4D:
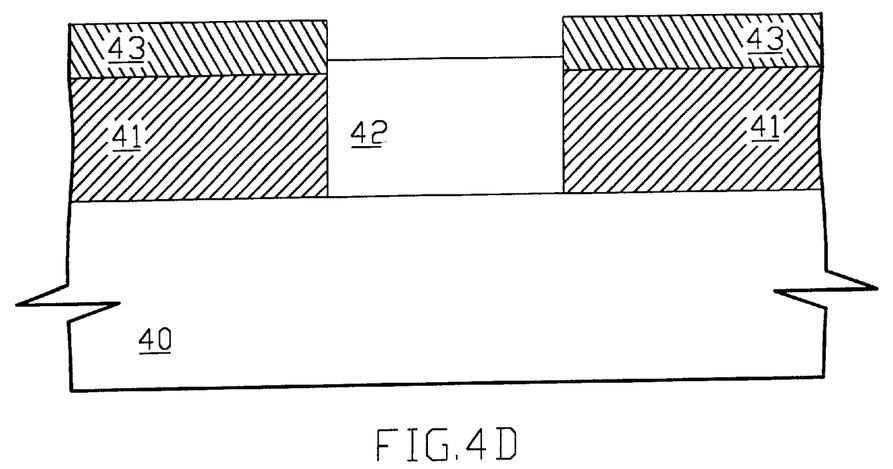
Figure 4E:
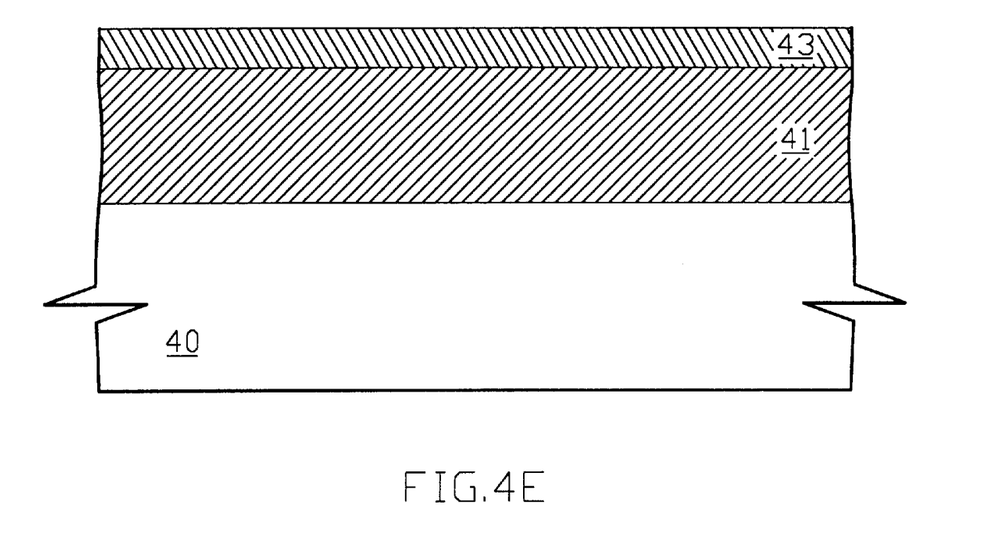
Figure 4F:
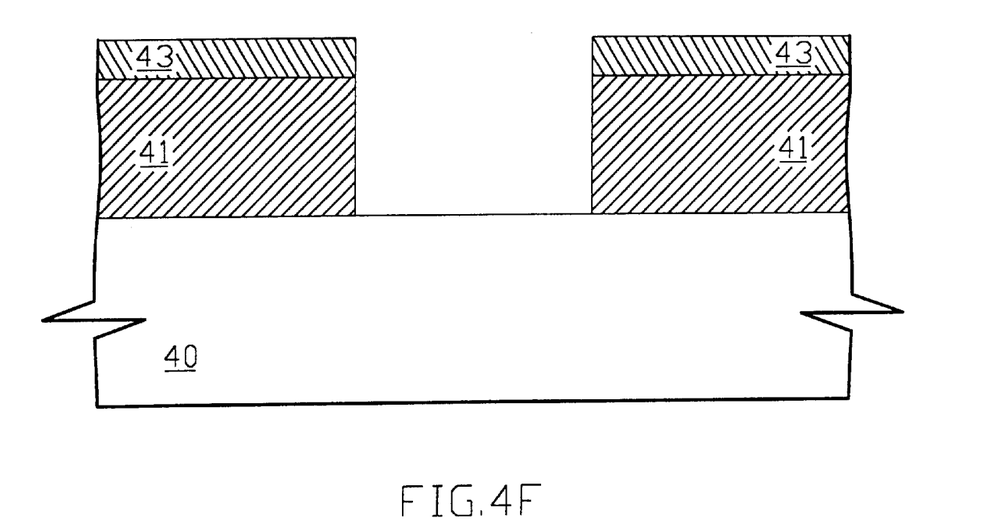
Figure 4G:
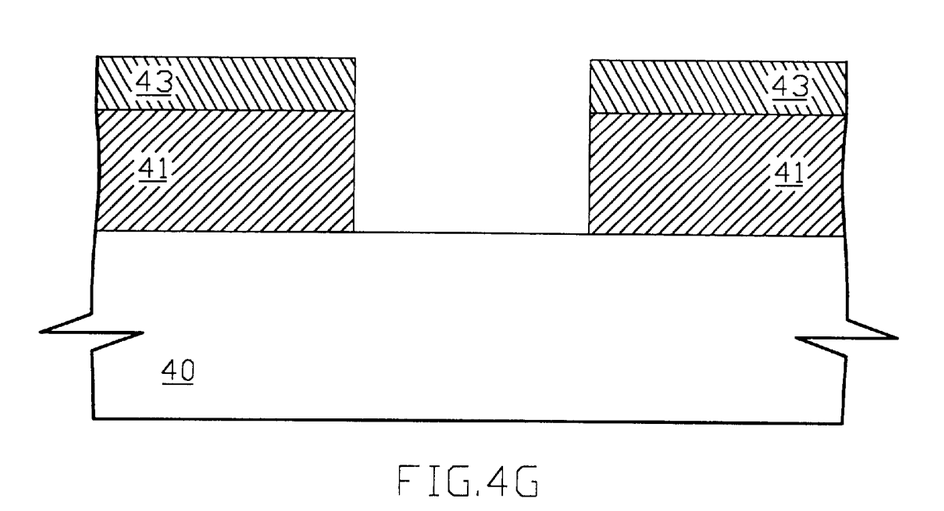

In FIG. 4B, metal layer 425 is formed on both first dielectric layer 42 and doped amorphous silicon layer 41, wherein material of metal layer 425 usual are refractory metal, such as titanium and cobalt. Next, performs a thermal process to let metal layer 425 react with doped amorphous silicon layer 41, and a result is that metal silicide layer 43 is formed on doped amorphous silicon layer 41. Whereby, thickness of doped amorphous silicon layer 41 is decreased for part of doped amorphous silicon layer 41 reacting with metal layer 425. Moreover, material of metal silicide layer 43 is chosen from the group consisting of: TiSi2, CoSi2, WSi2, PtSi2, HfSi2, TaSi2, TaSi2, MoSi2 and PdSi2. Then, as shown in FIG. 4D, removes unreacted metal layer 425 which is located on first dielectric layer 42. Finally, as FIG. 4G shows, removes first dielectric layer 42 to form a window which corresponds to location of gate of transistor, whereby this window is surrounded by both metal silicide layer 43 and doped amorphous silicon layer 41.

Surely, pervious forming processes of metal silicide layer 43, as shown in FIG. 4B through FIG. 4D, also can be replaced by following forming processes. First, as FIG. 4E shows that directly forms metal silicide layer 43 on doped amorphous silicon layer 41 by deposition, such as chemical vapor deposition, without application of first dielectric layer 42. Then, as FIG. 4F shows, removes part of metal silicide layer 43, by ways of photolithography and etch, to form a window which corresponds location of gate of transistor. Whereby, location of window of FIG. 4F is equal to location of window of FIG. 4G. Moreover, because metal silicide layer 43 is formed by deposition but not by reaction with doped amorphous silicon layer 41, thickness of doped amorphous silicon layer 41 is not decreased after metal silicide layer 43 is formed. However, it should be noted that the invention is not limited by forming process of metal silicide layer 43.

Figure 4H:
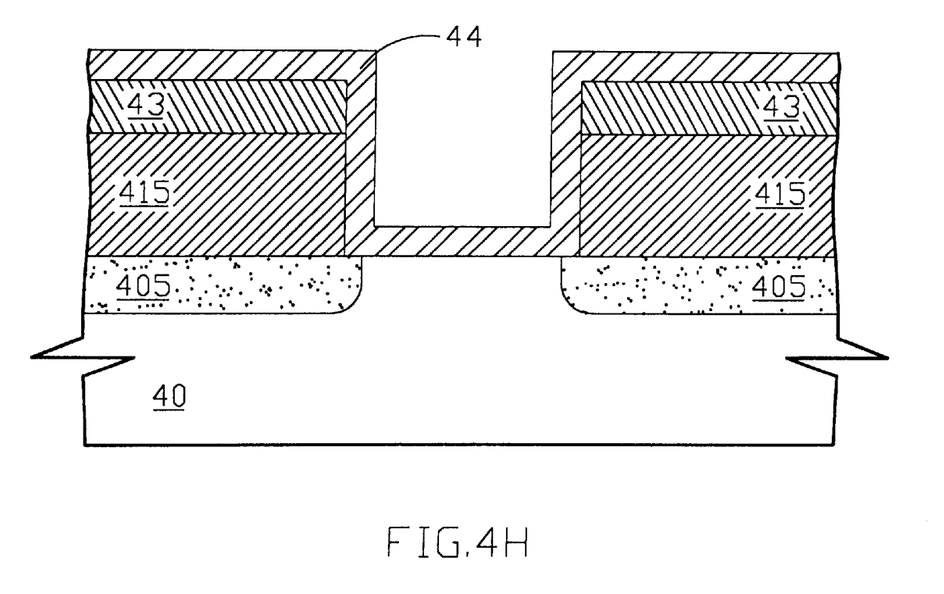

In FIG. 4H, second dielectric layer 44 is formed, usually is deposited, on both metal silicide layer 41 and window. Herein, second dielectric layer 44 usually is a conformal layer and window usually is not filled by second dielectric layer 44. Further, second dielectric layer 44 usually is chosen from the group consisting of: silicon oxynitride layer, silicon nitride layer, and silicon dioxide layer. Moreover, second dielectric layer 44 also can be combination of both silicon nitride layer and silicon dioxide layer, and second dielectric layer can be used as gate dielectric layer of transistor.

Significantly, owing to forming temperature of dielectric layer is high, especially when dielectric layer is formed by deposition, forming temperature of second dielectric layer 44 usually is enough high to drive numerous dopants inside doped amorphous silicon layer 41 into substrate 40 during formation of second dielectric layer 44. Then, a direct result is that dopants that driven in substrate 40 forms drain/source 405 in substrate 40, and while period is properly adjusted, drain/source 405 are shallow. Certainly, because dopants diffuses from doped amorphous silicon layer 41 into substrate 40, final concentration of dopants inside doped amorphous silicon layer 41 is not uniform and is proportional to the distance from surface of substrate 40. In other words, upper part of doped amorphous silicon layer 41 has higher dopants concentration and can behave as deep source-drain regions, lower part of doped amorphous silicon layer 41 has lower dopants concentration and can behave as source-drain extension regions but avoid the diffusion problem in their formation.

Besides, also owing to high forming temperature of second dielectric layer 44, doped amorphous silicon layer 41 can be re-crystallized to form an epi-like silicon layer 415 during formation of second dielectric layer 44. Thus, high quality of silicon can be formed without application of epitaxy which is complex and expensive. In other words, the invention present an effectively and practical process for forming the elevated source-drain MOSFET.

Figure 4I:
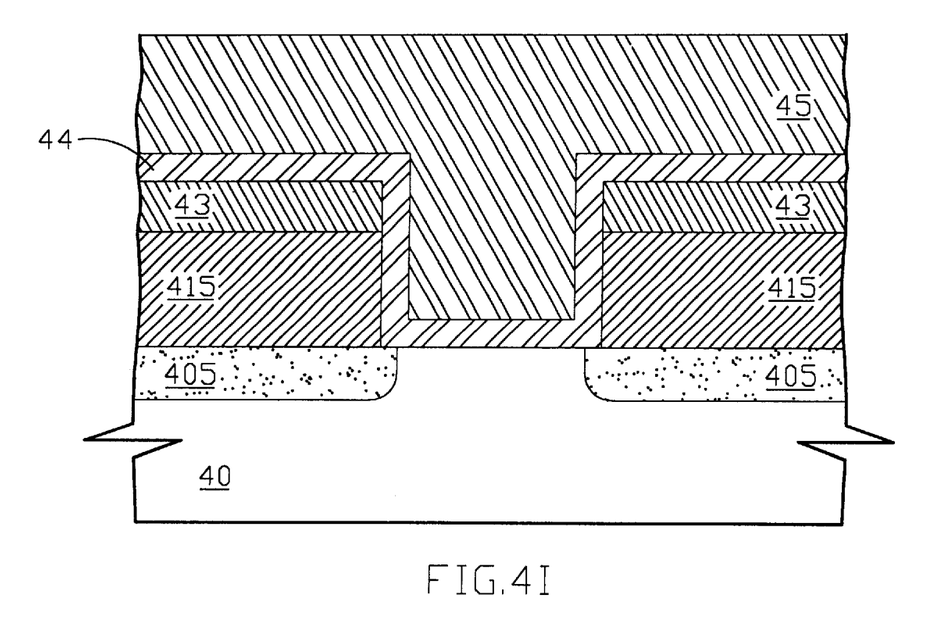

In FIG. 4I, conductor 45 is formed on second dielectric layer 44. In general, conductor layer 45 us polycide layer, metal layer or polysilicon layer, and typical thickness of conductor layer 45 is about from 500 angstroms to 3000 angstroms. Moreover, polycide layer usually is combination of polysilicon layer and tungsten silicide.

Figure 4J:
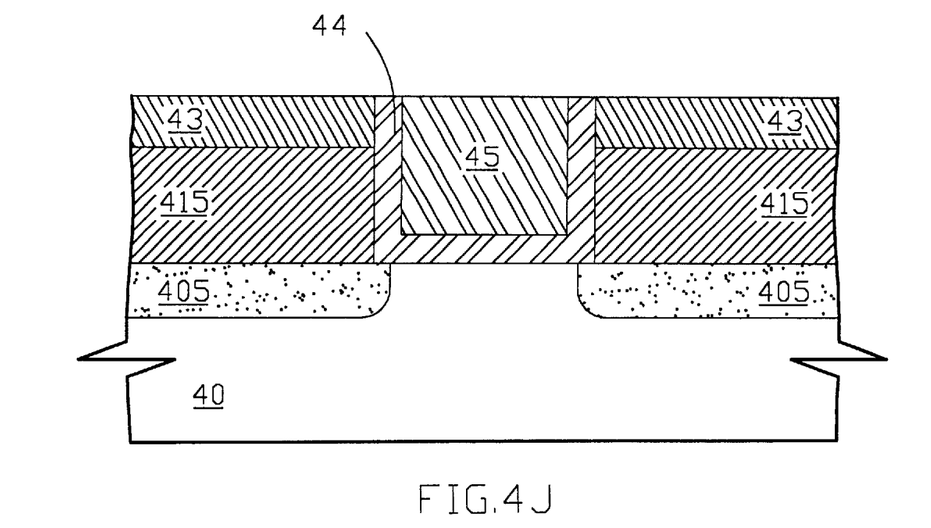

Finally, performs a polarization process, such as CMP process, by using second dielectric layer 44 as a stop layer, and then a metal-oxide-semiconductor transistor with both raised source/drain and metal silicide is formed, as FIG. 4J shows. Surely, conductor layer 45 and second dielectric layer 44 that outside window must be removed.

Figure 5A:
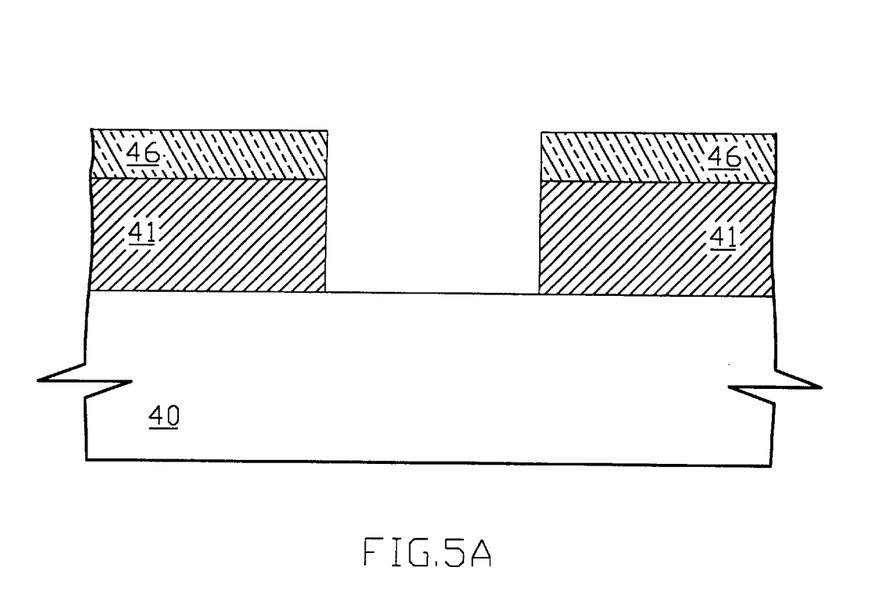
FIG. 5A through FIG. 5C are cross-section views of another embodiment of the invention.

Another performed embodiment is introduced as following: first, doped amorphous silicon layer 41 and metal layer 46 is formed on substrate 40 in sequence, and then both part of metal layer 41 and part of doped amorphous silicon layer 41 are removed to form a window, as FIG. 5A shows. Whereby, metal layer 46 can be any metal, such as cobalt and tungsten, which can be used to form metal silicide, and metal layer 46 usually is formed by deposition such as sputter and chemical vapor deposition (low pressure chemical vapor deposition or plasma enhanced chemical vapor deposition). Of course, material of metal layer 46 also can be chosen from the group consisting of Cu, Al, Ti, Co, W, Pt, Mo, Ta and Pd.

Figure 5B:
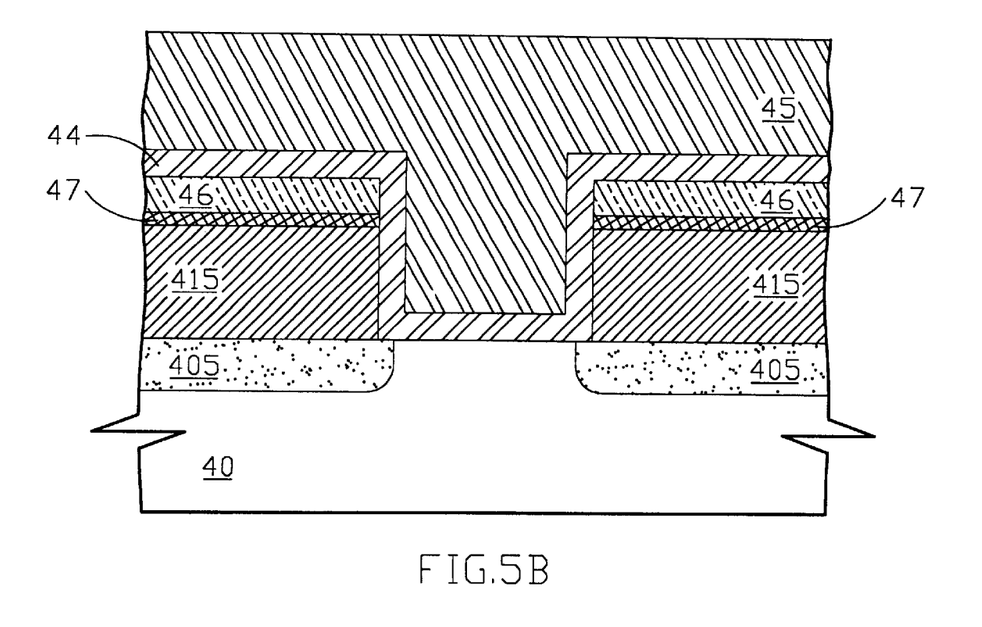

Then as FIG. 5B shows, forms second dielectric layer 44, usually by deposition, on both doped amorphous silicon layer 41 and window, and then forms conductor layer 45 on second dielectric layer 44. In general, window is mot totally filled by second dielectric layer 44, and shape of second dielectric layer 44 usually is conformal. Besides, numerous dopants inside doped amorphous silicon layer 41 diffuse into substrate 40 for thermal motion, doped amorphous silicon layer 41 also will be transferred into epi-like silicon layer 415 by re-crystallizing. Herein available materials of conductor layer 45 at least includes copper, aluminum, refractory metal, polysilicon, silicon, epi-silicon, and metal silicide; available materials of metal-silicon compound layer 47 at least include: tungsten silicide, cobalt silicide, titanium silicide, platinum silicide, manganese silicide, tantalum silicide and palladium silicide.

Further, by adjusting reacting time and reacting temperature of second dielectric layer 44, it is possible to let part of metal layer 46, which is closed to doped amorphous silicon layer 41, is transferred into metal-silicon compound layer 47, or to let metal layer 46 is totally transferred into metal-silicon compound layer 47, or to let account of part of metal layer 46, which is transferred into metal-silicon compound layer 47, is negligible. Moreover, FIG. 5B only shows the case that part of metal layer 46 is transferred into metal-silicon compound layer 47 during formation of second dielectric layer 44.

Figure 5C:
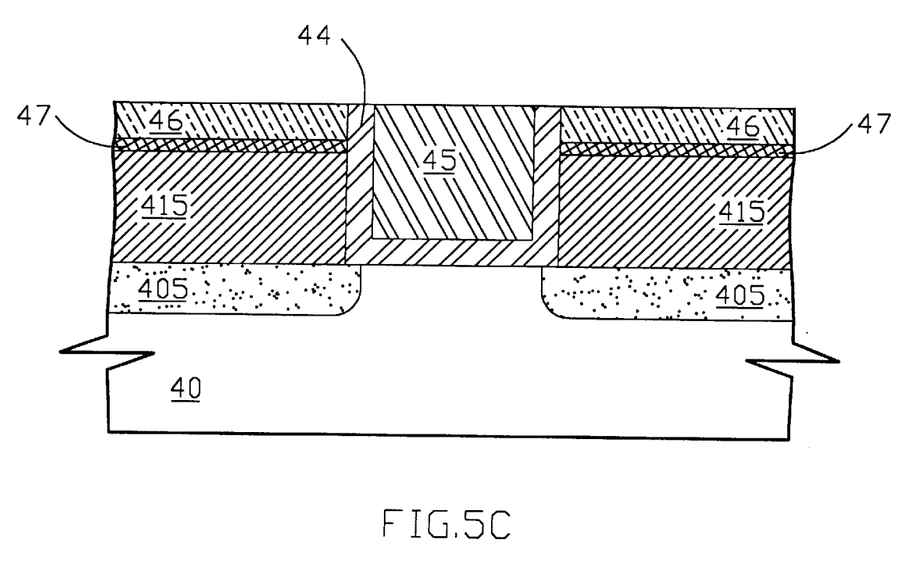

Finally, because that source, drain and gate of transistor usually are connected with conductive line, a polarization process, such as CMP process, is performed by using second dielectric layer 44 as stop layer to removed both part of conductor layer 45 and part of second dielectric layer that located over metal-silicon compound layer 47. And then a metal-oxide-semiconductor transistor with both raised source/drain and metal is formed, as FIG. 5C shows.

Additionally, it should be noted that gate of this transistor is formed by U-shape dielectric layer and conductor layer that located in hollow of U-shape dielectric layer, which is obviously different from conventional gate structure of prior arts. Moreover, metal-silicon compound layer 47 at least includes following: titanium-silicon compound layer, cobalt-silicon compound layer, tungsten-silicon compound layer, platinum-silicon compound layer, manganese-silicon compound layer, tantalum-silicon compound layer, and palladium-silicon compound layer.

Although specific embodiments have been illustrated and described, it will be obvious to those skilled in the art that various modifications may be made without departing from what is intended to be limited solely by the appended claims.

What is claimed is:

1. A metal-oxide-semiconductor transistor with a raised source/drain which at least includes a metal silicide, comprising
    a U-shape dielectric layer on said substrate;
    a conductor layer in a hallow of said U-shape dielectric layer, wherein said conductor layer is a combination of polysilicon layer and WSi2 layer;
    a first doped region in said substrate, said first doped region being located on one side of said U-shape dielectric layer;
    a second doped region in said substrate, said second doped region being located on another side of said U-shape dielectric layer;
    an epi-like silicon layer on said doped regions; and
    a metal silicide layer on said epi-like silicon layer.

2. The transistor of claim 1, wherein said U-shape dielectric layer is chosen from the group consisting of silicon nitride layer, silicon oxynitride layer, silicon dioxide layer, and combination of silicon dioxide layer and metal silicide nitride layer.

3. The transistor of claim 1, wherein said epi-like silicon layer can be replaced by a doped amorphous silicon layer.

4. The transistor of claim 1, wherein said conductor layer is chosen from the group consisting of polycide layer, polysilicon layer, metal silicide layer, and metal layer.

5. The method of claim 4, wherein said metal silicide layer is chosen from the group consisting of TiSi2 layer, CoSi2 Layer, WSi2 layer, PtSi2 layer, MoSi2 layer, TaSi2, and PdSi2.

6. A metal-oxide-semiconductor transistor with a metal raised source/drain, comprising
    a U-shape dielectric layer on said substrate;
    a conductor layer in a hallow of said U-shape dielectric layer;
    a first doped region in said substrate, said first doped region being located on one side of said U-shape dielectric layer;
    a second doped region in said substrate, said second doped region being located on another side of said U-shape dielectric layer;
    an epi-like silicon layer on said doped regions; and
    a metal layer and a metal silicide layer on said epi-like silicon layer.

7. The transistor of claim 6, wherein said metal layer is chosen from the group consisting of Cu, Al, Ti, Co, W, Pt, Mo, Ta and Pd.

8. The transistor of claim 6, further comprises a metal-silicon compound layer in an interface between said metal layer and said epi-like silicon layer.

9. The transistor of claim 8, wherein said metal-silicon compound layer is chosen from the group consisting of titanium-silicon compound layer, cobalt-silicon compound layer, tungsten-silicon compound layer, platinum-silicon compound layer, manganese-silicon compound layer, tantalum-silicon compound layer, and palladium-silicon compound layer.

10. The transistor of claim 6, wherein said U-shape dielectric layer is chosen from a group consisting of silicon nitride layer, silicon oxynitride layer, silicon dioxide layer, and combination of silicon dioxide layer and metal silicide nitride layer.

11. The transistor of claim 6, wherein said epi-like silicon layer can be replaced by a doped amorphous silicon layer.

12. The transistor of claim 6, wherein said conductor layer is chosen from the group consisting of polycide layer, polysilicon layer, and metal layer.

13. The transistor of claim 12, wherein said polysilicide layer is a combination of polysilicon layer and Wsi2 layer.

14. The method of claim 6, wherein said metal silicide layer is chosen from the group consisting of TiSi2 layer, CoSi2 Layer, WSi2 layer, PtSi2 layer, MoSi2 layer, TaSi2, and PdSi2.

15. A metal-oxide-semiconductor transistor with a metal raised source/drain, comprising
    a U-shape dielectric layer on said substrate;
    a conductor layer in a hallow of said U-shape dielectric layer, wherein said polycide layer is a combination of polysilicon layer and WSi2 layer;
    a first doped region in said substrate, said first doped region being located on one side of said U-shape dielectric layer;
    a second doped region in said substrate, said second doped region being located on another side of said U-shape dielectric layer;
    an epi-like silicon layer on said doped regions; and
    a metal layer and a metal silicide layer on said epi-like silicon layer.

16. The transistor of claim 15, wherein said metal layer is chosen from the group consisting of Cu, Al, Ti, Co, W, Pt, Mo, Ta and Pd.

17. The transistor of claim 15, further comprises a metal-silicon compound layer in an interface between said metal layer and said epi-like silicon layer.

18. The transistor of claim 17, wherein said metal-silicon compound layer is chosen from the group consisting of titanium-silicon compound layer, cobalt-silicon compound layer, tungsten-silicon compound layer, platinum-silicon compound layer, manganese-silicon compound layer, tantalum-silicon compound layer, and palladium-silicon compound layer.

19. The transistor of claim 15, wherein said U-shape dielectric layer is chosen from a group consisting of silicon nitride layer, silicon oxynitride layer, silicon dioxide layer, and combination of silicon dioxide layer and metal silicide nitride layer.

20. The transistor of claim 15, wherein said epi-like silicon layer can be replaced by a doped amorphous silicon layer.

21. The method of claim 15, wherein said metal silicide layer is chosen from the group consisting of TiSi2 layer, CoSi2 Layer, WSi2 layer, PtSi2 layer, MoSi2 layer, TaSi2, and PdSi2.

* * * * *